(12) United States Patent
Sekiguchi

(10) Patent No.: US 7,064,699 B2
(45) Date of Patent: Jun. 20, 2006

(54) CURRENT CELL MATRIX TYPE DIGITAL-TO-ANALOG CONVERTER

(75) Inventor: Masaru Sekiguchi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 105 days.

(21) Appl. No.: 10/983,644

(22) Filed: Nov. 9, 2004

(65) Prior Publication Data

US 2005/0200509 A1    Sep. 15, 2005

(30) Foreign Application Priority Data

Mar. 4, 2004 (JP) ............................. 2004-060412

(51) Int. Cl.
*H03M 1/66* (2006.01)
(52) U.S. Cl. ...................... 341/144; 341/118; 341/145
(58) Field of Classification Search ................ 341/144, 341/145, 118, 120, 152, 136
See application file for complete search history.

(56) References Cited

U.S. PATENT DOCUMENTS 5,760,725 A * 6/1998 Yoshida et al. ............. 341/144
5,764,094 A * 6/1998 Hatsuda ....................... 327/333
6,353,402 B1 * 3/2002 Kanamori .................... 341/118

FOREIGN PATENT DOCUMENTS

JP          09-051350          2/1997

* cited by examiner

*Primary Examiner*—John B Nguyen
(74) *Attorney, Agent, or Firm*—Nixon Peabody LLP; Donald R. Studebaker

(57) ABSTRACT

A converter 10 selects desired unit current cells from unit current cells 16, 18, 20, 22 in accordance with an input code 102, and supplies currents from the selected cells to a load resistor 24 to generate an analog voltage Vdac. By supplying the constant current comprised of the currents from the selected cells and currents from non-selected cells to an offset adjuster circuit 26 including an adjusting resister 28 to generate an offset voltage Vos, the converter 10 can output a voltage Vout which is the sum of the analog voltage Vdac and the offset voltage Vos.

7 Claims, 13 Drawing Sheets

CURRENT CELL MATRIX TYPE DIGITAL-TO-ANALOG CONVERTER

BACKGROUND OF THE INVENTION

1. Field of the Invention:

The present invention relates to a current-cell matrix type digital-to-analog converter for producing an analog signal output corresponding to a digital signal input thereto.

2. Description of the Related Art:

Conventionally, when some current matrix type digital-to-analog (D/A) converter receives an analog output from a circuit, LSI (Large Scale Integration), or the like having an offset voltage, for example, directly connected thereto without a capacitor, the D/A converter applies the analog output with an offset voltage in conformity to the offset voltage of the connected circuit for adjustment.

For example, as shown in FIG. 4, a digital communication transmitter or the like comprises a modulator 1 for generating a baseband signal; and an orthogonal modulator 2 for orthogonally modulating the baseband signal in an analog domain to output an orthogonal modulated signal. Since the modulator 1 and the orthogonal modulator 2 are composed of semiconductor integrated circuits manufactured through different processes, they can differ from each other in signal potentials which maximize the performance, such as a signal-to-noise ratio, a modulation accuracy, and the like. Therefore, baseband signals I(t) and Q(t) from the modulator 1 must be applied with offset voltages, respectively, for adjustment such that a DC level signal potential of the baseband signals I(t) and Q(t), i.e., the signal ground potential matches a signal ground potential which is optimal for the performance of the orthogonal modulator 2.

The modulator 1 applies serial-to-parallel conversion on a binary transmission data in a logic circuit 3, and further differentially encodes the resulting parallel binary transmission data which is output to signal waveform generators 4, 5 that output baseband signals I(t) and Q(t) to the orthogonal modulator 2, respectively. Here, for example, as shown in FIG. 14, the signal waveform generator 4 inputs a digital signal from a ROM (Read Only Memory) 6 to a current-cell matrix type D/A converter 910 for processing. The resulting analog signal is applied with an offset voltage in a level shifter circuit 920 to generate a baseband signal which is output through a low pass filter 7

For example, the current-cell matrix type D/A converter 910 described in Japanese Patent Application Kokai No. 9-51360 (hereinafter referred to as "patent document-1") is connected to a level shift circuit 920, and outputs an analog signal Vout to the level shift circuit 920, as shown in FIG. 12. The level shift circuit 920 has a first signal level shifter 930 which adds a level shift voltage to the analog signal Vout to output a baseband signal Vls to which an offset voltage has been applied.

As shown in FIG. 12, the level shift circuit 920 comprises a first level shifter 930; a signal ground potential determination circuit 940 which is a first reference potential generating means; a signal center potential reference circuit 950 which is a second reference potential generating means; a second signal level shifter 960; and an operational amplifier 970. The current-cell matrix type D/A converter 910 comprises a row decoder 12, a column decoder 14, a load resistor 24, and a plurality of unit current cells 912, 914, 916, 918. The level shift circuit 920 selects a unit current cell in accordance with a 10-bit input code 102, and applies the load resistor 24 with a current flowing from the selected unit current cell to determine the potential for the analog signal Vout.

A plurality of unit current cells 912, 914, 916, 918 are each configured as shown in FIG. 13. For example, each of the unit current cells 912 outputs a predetermined output when a row decode signal and a column decode signal are both at "H." This current value can be set by adjusting the width of a gate of a current regulating transistor 36. Also, each of the unit current cells is supplied with a bias voltage 104 input to the current-cell matrix type D/A converter 910 from the outside.

The current-cell matrix type D/A converter 910 includes ($2^6$-1) current cells 912, having a current value of $I0/2^7$, arranged on an array, and one each of the unit current cell 914 having a current value of $I0/2^8$, the unit current cell 916 having a current value of $I0/2^9$, and the unit current cell 918 having a current value of $I0/2^{10}$. The upper six bits of the input code 102 is D/A converted by a selected number of the unit current cells 912 having a current value of $I0/2^7$, while the lower three bits of the input code 102 are D/A converted depending on whether to select the unit current cells 914, 916, 918, the current values of which are weighted, resulting in 9-bit D/A conversion in total.

The first signal level shifter 930, which comprises a source follower circuit made up of PMOS (P-channel Metal-Oxide Semiconductor) transistors 932, 934, adds a level shift voltage to the analog signal Vout output from the current-cell matrix type D/A converter 910 in an analog domain to output the baseband signal Vls. In this event, the PMOS 932 is applied with the analog signal Vout at its gate, while the PMOS 934 is applied with an output potential Vbls from the operational amplifier 970 at its gate to output the signal Vls from the source of the PMOS 932 (drain of the PMOS 934).

The signal ground potential determination circuit 940 is comprised of a plurality of resistors 942 connected in series between a power supply and the ground, and a selector circuit 944. The selector circuit 944 selects a potential at one connection from the plurality of resistors 942 in accordance with an offset voltage adjusting signal 980 input thereto to determine a signal ground voltage Vsg as a first reference potential.

The signal center potential reference circuit 950, which is comprised of resistors 952, 954 connected in series between the power supply and ground, outputs the potential at a connection of the two resistors as a signal center potential Vm which is a second reference potential. The resistances of the resistors 952, 954 are set such that the potential Vm is equal to a center potential Vct of the analog voltage Vout output from the current-cell matrix type D/A converter 910.

The second signal level shifter 960 is identical in configuration to the first signal level shifter 930, or is designed such that a device size ratio of a PMOS transistor 962 to a PMOS transistor 964 is equal to a device size ratio of the PMOS 932 to PMOS 934, with the PMOSs 932, 934 making up the first signal level shifter 930. The PMOS 962 is applied at its gate with the signal center potential Vm from the signal center potential reference circuit 950, while the PMOS 964 is applied at its gate with the bias potential signal Vbls from the operational amplifier 970, causing a potential Vrpl to be output from the source of the PMOS 964 (drain of the PMOS 964).

For example, each of the signal waveform generators 4, 5 for supplying a baseband signal to the orthogonal modulator 2 comprises the current-cell matrix type D/A converter 910 as described above, and can adjust an the offset signal applied to the baseband signal in order to match the signal ground potential for the baseband signal with an optimal signal ground potential for the performance of the orthogonal modulator 2.

The current-cell matrix type D/A converter described in the patent document-1, which is connected to a level shift circuit, can apply and adjust the offset voltage to the analog signal.

However, a large circuit scale of the level shift circuit described in the patent document-1 results in an increase in the chip area including the current-cell matrix type D/A converter. Also, when the analog signal is differentially output from the current-cell matrix type D/A converter, two of the level shift circuits are required to cause a further increase in the circuit scale.

When the analog signal output form the current-cell matrix type D/A converter is converted to a voltage by the level shift circuit to output the baseband signal, the first signal level shifter, in particular, is affected by the voltage-current (V-I) characteristic in the transistor 12a to degrade the linearity of the output baseband signal.

SUMMARY OF THE INVENTION

It is an object of the present invention to solve the disadvantages of the prior art as described above, and to provide a current-cell matrix type digital-to-analog converter for applying an offset voltage to an analog voltage signal corresponding to a digital signal input thereto.

To solve the foregoing problems, the present invention provides a current-cell matrix type digital-to-analog converter which includes a plurality of unit current cells arranged in a matrix form, each of which is selected or non-selected in accordance with a digital signal, a first connection line supplied with a first current from all selected unit current cells of the plurality of unit current cells, and a first load resistor connected to the first connection line and supplied with the first current, wherein the converter further includes a second connection line supplied with a second current which is an inverted output of the first current from all non-selected unit current cells of the plurality of unit current cells, and an offset adjuster circuit connected to the first connection line through a first load resistor and connected to the second connection line, the offset adjuster circuit produces a constant voltage based on the first current supplied from the first connection line and a second current supplied from the second connection line irrespective of whether the plurality of unit current cells are selected or non-selected, to generate an offset voltage, and the converter outputs a first analog voltage signal based on a first potential generated across the first load resistance from the first current and the offset voltage.

According to the current-cell matrix type D/A converter of the present invention, by connecting currents from selected unit current cells and currents from non-selected unit current cells to the offset adjusting resister, a constant offset voltage can be generated irrespective of the selection of the unit current cells without increasing the circuit scale. Further, the offset voltage can be output without degrading the linearity thereof.

Also, according to the present invention, by connecting a capacitor to the offset adjusting capacitor, fluctuations in current caused by the switching of each unit current cell between selection and non-selection can be suppressed in the offset adjusting resistor. In this way, fluctuations in the offset voltage can be suppressed to output a clear waveform of the output voltage.

Also, according to the present invention, the current-cell matrix type D/A converter includes a plurality of offset adjusting resistors, and switches associated with the plurality of offset adjusting resistors, respectively. By switching the switches in response to an offset voltage adjusting signal, the offset voltage can be adjusted.

Also, according to the present invention, the current-cell matrix type D/A converter includes a load resistor supplied with currents from selected unit current cells, and a load resistor supplied with currents from non-selected unit current cells. By supplying the respective currents to the offset adjusting resistor, the current-cell matrix type D/A converter can also generate the offset voltage even when a differential voltage is output, and can adjust the offset voltage value.

DETAILED DESCRIPTION OF THE INVENTION

Figure 4:
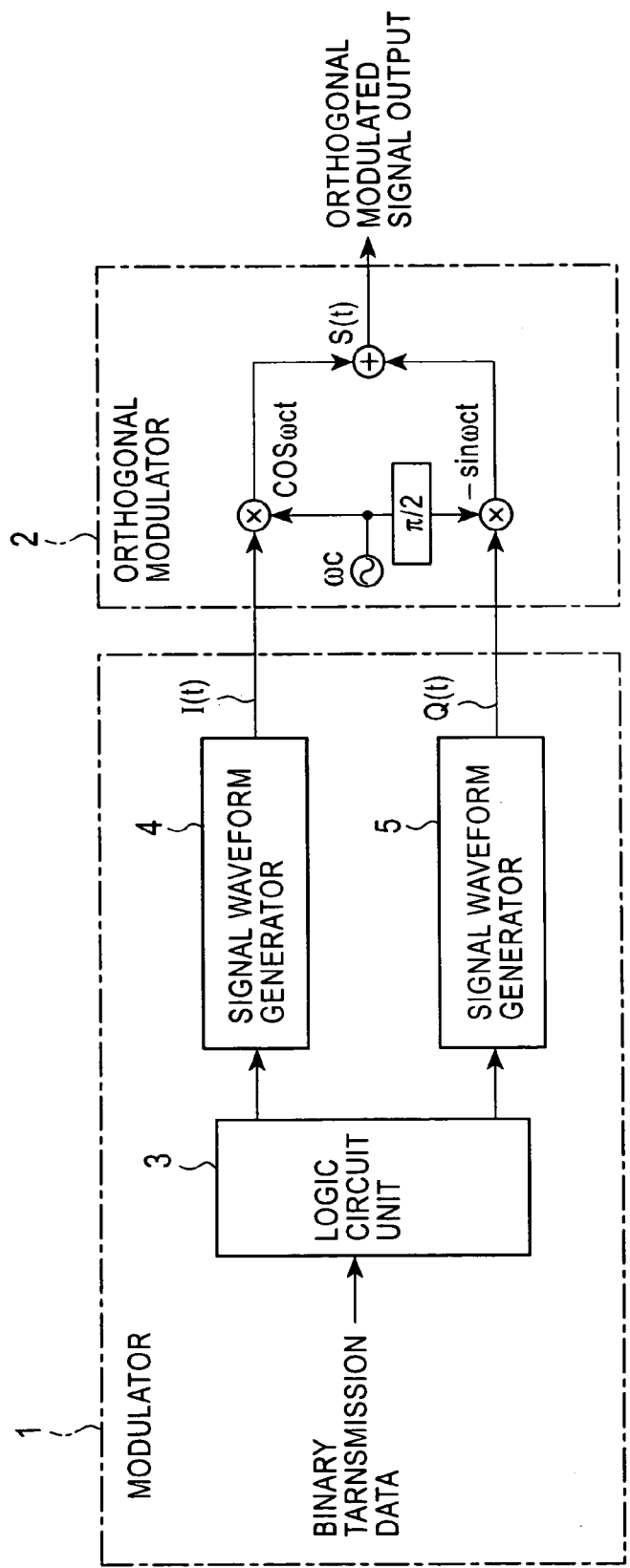
FIG. 4 is a block diagram showing a digital communication transmitter.
Figure 5:
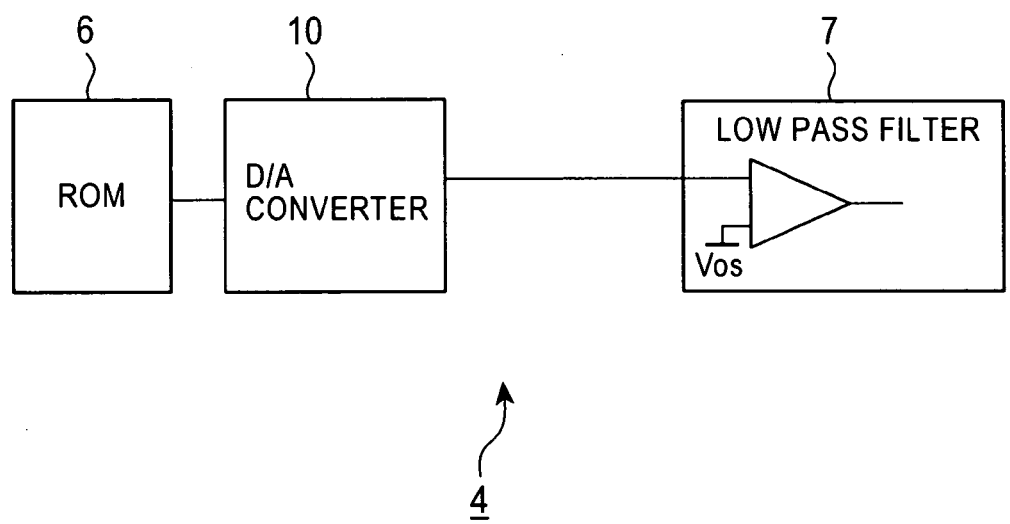
FIG. 5 is a block diagram showing an exemplary circuit configuration of a current-cell matrix type D/A converter according to the present invention when it is applied to a signal waveform generator in the transmitter shown in FIG. 4.
Figure 6:
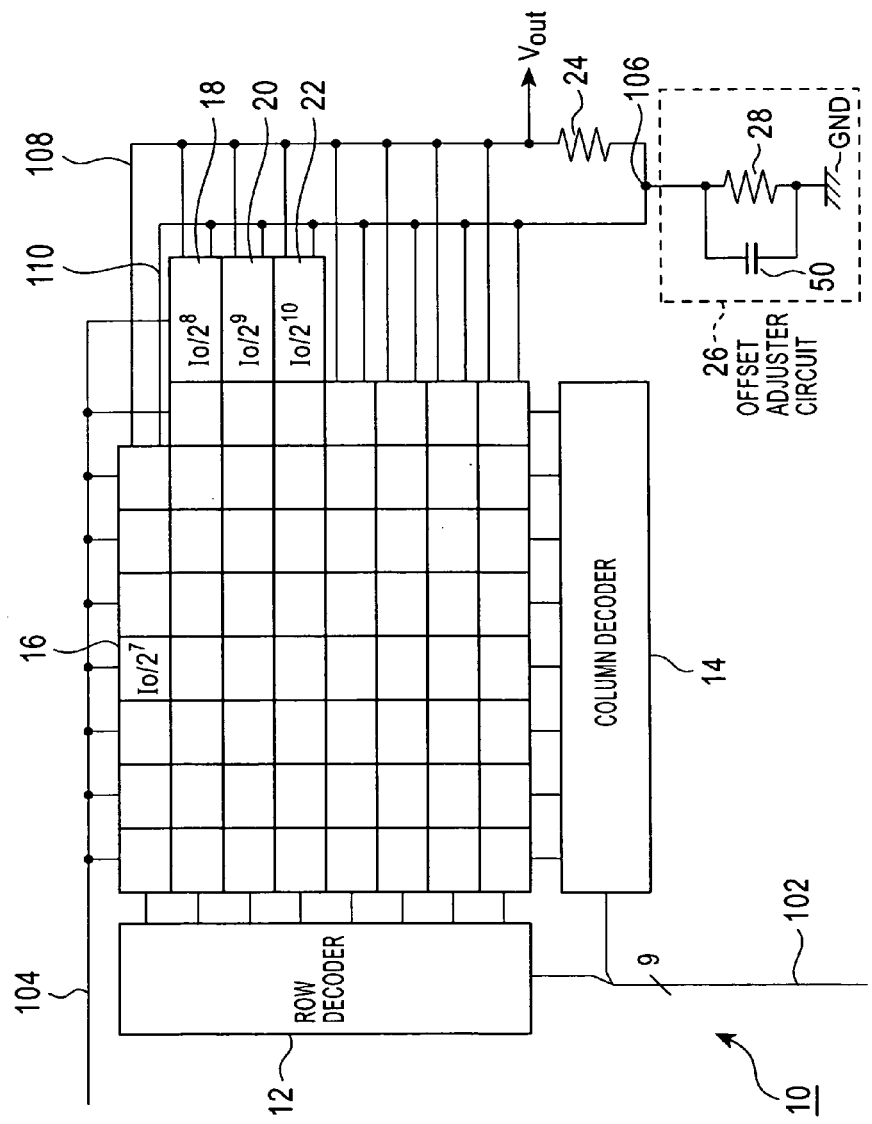
FIG. 6 is a block diagram showing another embodiment of the current-cell matrix type D/A converter according to the present invention.

Embodiments of a current-cell matrix type D/A converter according to the present invention will be described in detail with reference to the accompanying drawings. For example, as shown in FIG. 5, a current-cell matrix type D/A converter 10 is applied to a signal waveform generator 4 to process a digital signal from a ROM 6, and output a baseband signal through a low pass filter 7. Also, as shown in FIG. 4, a modulator 1, to which the signal waveform generator 4 is applied, applies serial-to-parallel conversion on binary transmission data in a logic circuit 3, and further differentially encodes the resulting parallel signal which is output to signal wave generator circuits 4, 5, each including the current-cell matrix type D/A converter 10. The signal waveform generators 4, 5 output baseband signals I(t), Q(t), respectively, to an orthogonal modulator 2.

Since the modulator 1 and the orthogonal modulator 2 are composed of semiconductor integrated circuits manufactured through different processes, they can differ from each other in signal potentials which maximize the performance, such as a signal-to-noise ratio, a modulation accuracy, and the like. Particularly, since the D/A converter 10 to orthogonal modulator 2 in each of the signal waveform generator 4, 5 are made up of analog circuits, baseband signal I(t) and Q(t) must be applied with offset voltages, respectively, for adjustment such that DC level signal potential of the baseband signals I(t) and Q(t), i.e., the signal ground potential matches a signal ground potential which is optimal for the performance of the orthogonal modulator 2.

Figure 1:
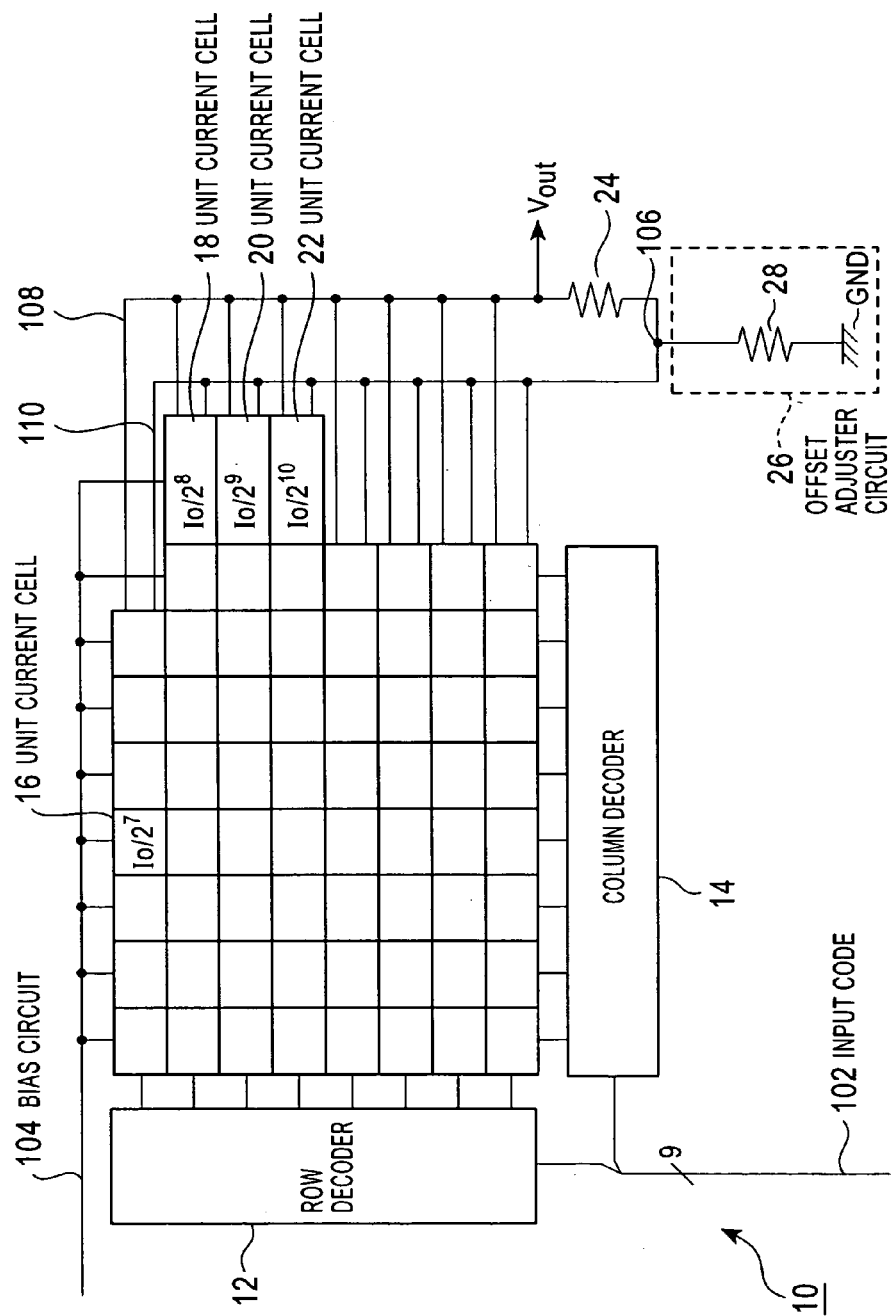
FIG. 1 is a block diagram showing one embodiment of a current-cell matrix type D/A converter according to the present invention.

Referring to FIG. 1, an embodiment of the current-cell matrix type D/A converter 10 according to the present invention supplies an input code 102, which is a digital signal, to a plurality of unit current cells 16, 18, 20, 22 through a row decoder 12 and a column decoder 14 to select a desired unit current cell, supplies currents from the selected unit current cells to an offset adjuster circuit 26 through a load resistor 24, and supplies currents from non-selected unit current cells to the offset adjuster circuit 26 to generate an offset voltage Vos, for outputting an analog voltage Vout. Illustration is omitted for parts not directly related to the present invention to avoid redundant description.

In this embodiment, the row decoder 12 and column decoder 14 supply a row decode signal and a column decode signal, respectively, in accordance with the input code 102, to a plurality of unit current cells 16, 18, 20, 22 to select desired unit current cells. In the following description, each signal is identified by a reference numeral which designates a connection line on which the signal appears.

For example, in the current-cell matrix type D/A converter 10 which is supplied with a 9-bit input code 102, a matrix is made up of the unit current cells 16 for D/A converting the upper six bits of the input code 102; and a plurality of unit current cells including the unit current cells 18, 20, 22 for D/A converting the lower three bits of the input code 102. Here, the ($2^6$-1) unit current cells 16 are arranged in an array form on the matrix for converting the upper six bits. The unit current cells 18, 20, 22 are individually arranged for representing the lowerbits. Also, the unit cells 18, 20, 22 are weighted by $1/2^1$, $1/2^2$, $1/2^3$, respectively, from the upper bit with respect to the unit current cells 16. When a selected unit current cell 16 outputs a current value of $I0/2^7$ to a connection line 108, the selected unit current cells 18, 20, 22 output current values of $I0/2^8$, $I0/2^9$, $I0/2^{10}$, respectively, to the output line. The current value I0 is a full scale current value when all output currents flow from a plurality of unit current cells into the load current 24. Unit current cells, which are not selected, output similar current values to those which are output when they are selected.

Figure 2:
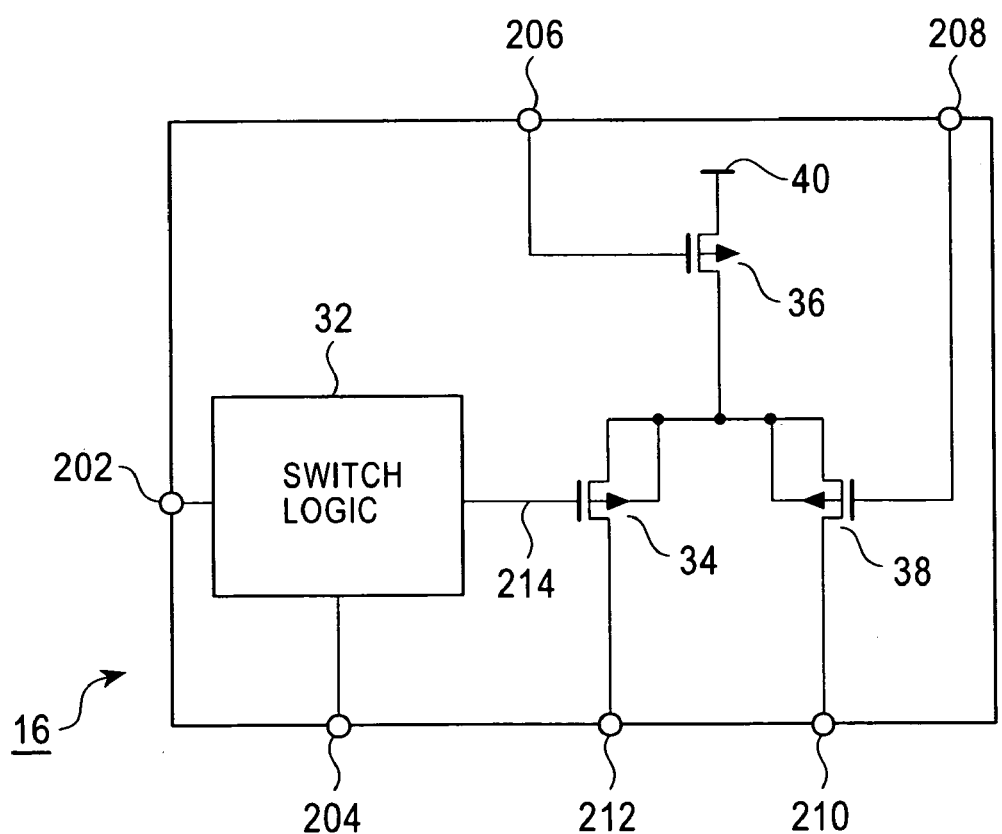
FIG. 2 is a block diagram illustrating a unit current cell in the current-cell matrix type D/A converter shown in FIG. 1.

For example, the unit current cell 16 comprises a switch logic circuit 32 connected to a row decode signal input terminal 202 and to a column decode signal input terminal 204, and current regulating transistors 34, 36, 38, as shown in FIG. 2. The unit current cell 16 processes signals supplied from the switch logic circuit 32, a power supply 40, and bias voltage input terminals 206, 208, and outputs the processed signals to an output terminal 210 or to an inverted output terminal 212. The unit current cells 18, 20, 22 are also built in a similar manner to the unit current cell 16.

These row decode signal terminal 202 and column decode signal terminal 204 are applied with a row decode signal supplied from the row decoder 12 and a column decode signal supplied from the column decoder 14, respectively. Also, the bias voltage input terminals 206, 208 are supplied with a bias voltage applied to the current-cell matrix D/A converter 10 from the outside.

Here, in the unit current cell 16, the switch logic circuit 32 outputs in an inverter configuration, and the transistor 38 is applied at its gate with a threshold voltage of an inverter in the switch logic circuit 32 as a bias voltage. In this event, when the output of the inverter is at H level, the transistor 38 turns on, while the transistor 34 turns off, causing a current generated by the transistor 36 to fully flow through the transistor 38 to the output terminal 210. On the other hand, when the output of the inverter is at L level, the transistor 38 turns off, while the transistor 34 turns on, causing a current generated by the transistor 36 to fully flow through the transistor 34 to the inverted output terminal 212. Alternatively, the transistor 38 may be applied at its gate with an inverted version of the output of the switch logic circuit 32.

The unit current cells 16, 18, 20, 22 each output a predetermined current from the output terminal 210 when both the row decode signal and column decode signal indicate the H level. On the other hand, when both the row decode signal and column decode signal do not indicate the H level, for example, when the row decode signal is at L level and the column decode signal is also at L level, or when the row decode signal is at L level but the column decode signal is at H level, or when the row decode signal is at H level but the column decode signal is at L level, the unit current cells 16, 18, 20, 22 each output a predetermined voltage from the inverted output terminal 212.

While in this embodiment, PMOS transistors are used for the transistors 34, 36, 38 as shown in FIG. 2, NMOS (N-channel Metal-Oxide Semiconductor) transistors may be used instead. Further alternatively, bipolar transistors may be used instead of the MOS transistors. The current value output from the output terminal 210 or inverted output terminal 212 can be set in accordance with an adjustment made for the gate width of the transistor 36.

The load resistor 24 in this embodiment may be, for example, a resistor having a resistance value Rdac, and is supplied with a current Idac from a selected unit current cell to generate a voltage Vdac (=Idac×Rdac) indicating an analog waveform.

The offset adjuster circuit 26 is a circuit for generating an offset voltage, i.e., a reference voltage, and comprises an adjusting resistor 28 having the resistance value Ros, and a ground GND. Also, a current from a selected unit current cell is mixed with currents from non-selected unit current cells at a connection 106 to generate a sum current Ios which is supplied to the offset adjusting resistor 28 to generate an offset voltage Vos thereacross. Therefore, the potential at the connection 106 is equal to the offset voltage Vos. Alternatively, the offset adjusting resistor 28 may be connected from the outside, with its resistance value Ros adjusted to change the offset voltage.

Next, description will be made on the operation of the current-cell matrix type D/A converter 10 in this embodiment.

In this embodiment, an input code 102, which is a 9-bit digital signal, is first input to the current-cell matrix type D/A converter 10, and supplied to the row decoder 12 and column decoder 14.

In the row decoder 12 and column decoder 14, the upper six bits of the input code 102 are supplied to a plurality of unit current cells 16, while the lower three bits are supplied to the unit current cells 18, 20, 22. In each unit current cell, whether or not the unit current cell is selected is determined in accordance with the input code 102.

In accordance with this determination, a current from a selected unit current cell is supplied to the connection line 108, while currents from unit current cells not selected are supplied to a connection line 110.

In this embodiment, the current Idac from all selected unit current cells is supplied to the load resistor 24 to generate the voltage Vdac (=Idac×Rdac) across the load resistor 24 having the resistance value Rdac. The current Idac is also supplied to the connection 106.

On the other hand, the currents from all unit current cells not selected are supplied to the connection 106 through the connection line 110. The value of the current supplied from the connection line 110 is always equal to an inverse of the current supplied from the connection 108.

Here, the currents supplied to the connection 106 are indicated by the sum of the currents supplied from the connection line 108 and connection line 110, i.e., the sum Ios of the currents output by all the selected unit current cells and all the non-selected unit current cells. The current sum Ios is calculated by $Ios=(I0/2^7 \times (2^6-1))+(I0/2^8)+(I0/2^9)+(I0/2^{10})$ and provides a constant current irrespective of which of the unit current cells are selected.

Therefore, when the offset adjusting resistor 28 has the resistance value Ros, the offset voltage Vos (=Ios×Ros) is generated across the offset adjusting resistor 28, and the offset potential Vos is indicated at the connection 106.

As a result, the current-cell matrix type D/A converter 10 outputs a voltage Vout (=Vdac+Vos) which is offset by the potential Vos at the connection 106 from the voltage Vdac across the load resistor 24.

Figure 3:
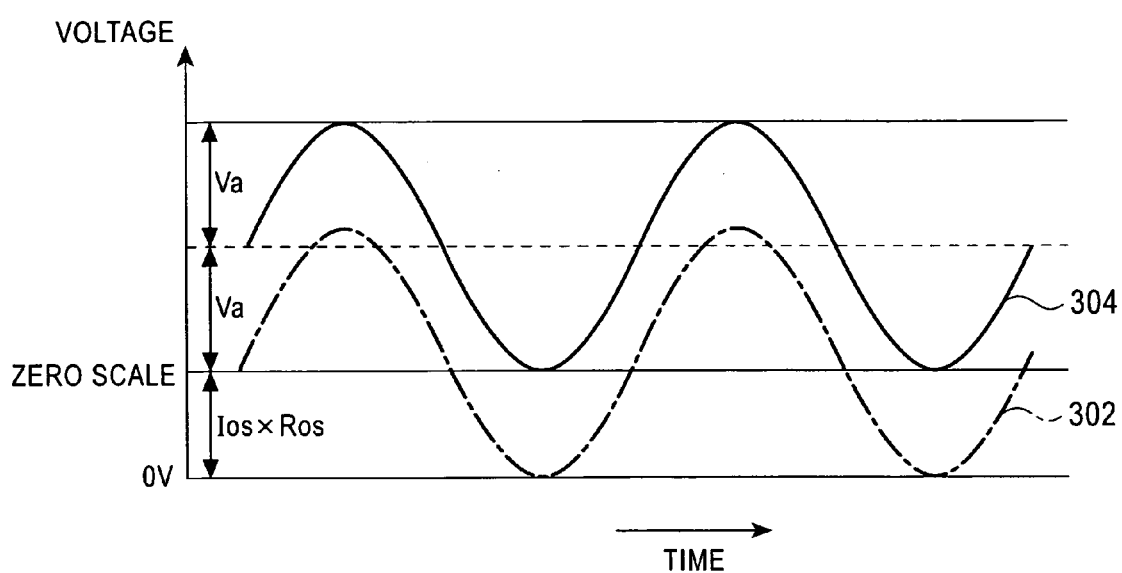
FIG. 3 is a diagram showing the waveform of an output voltage at the current-cell matrix type D/A converter shown in FIG. 1.

For example, when sinusoidal data having an amplitude va is input as the 9-bit input code, the analog voltage Vout presents a waveform 304 which can be represented as shown in FIG. 3, wherein a sinusoidal waveform 302 of the amplitude va, represented by the voltage Vac, indicates a zero scale (ZS), i.e., a reference potential.

While the current-cell matrix type D/A converter 10 of the present invention may be applied with an n-bit (n is a natural number) digital signal as the input code 102, a 9-bit digital signal is applied for avoiding the complexity in this embodiment. Also, while the unit current cells are arranged in a 9-bit matrix form in this embodiment, they may be arranged in an n-bit matrix form as long as equal currents flow through the respective rows.

As another embodiment, the current-cell matrix type D/A converter 10 comprises a capacitor 50 having a capacitance Cos in the offset adjuster circuit 26, which has both ends connected to both ends of the offset adjusting resistor 28, as shown in FIG.

Generally, when each unit current cell is switched from selection to non-selection, an off period occurs, in which, though for a short time period, a predetermined current does not flow. This causes a reduction in the current sum Ios supplied to the offset adjuster circuit 26 and a resulting reduction in the offset voltage Vos.

For example, the predetermined current is supplied to the output terminal after the lapse of the off period, subsequent to the end of a supply to the inverted output terminal, when a transition is made from a state in which at least one of the row decode signal and column decode signal is at L level (i.e., when they are both at L level, or when one is at L level and the other is at H level, or when one is at H level and the other is at L level) to a state in which both the row decode signal and column decode signal are at H level (the respective signals are at H level and at H level, respectively). Also, the predetermined current is supplied to the inverted output terminal after the lapse of the off period, subsequent to the end of a supply to the inverted output terminal, when a transition is made from the state in which both the row decode signal and column decode signal are at H level to the state in which at least one of the row decode signal and column decode signal is at L level.

Further, as each current cell 16 is switched from selection to non-selection, a transient current flows through a parasitic capacitance of the transistor 36, causing the current sum Ios to increase and decrease in the offset adjuster circuit 26 and the offset voltage Vos to fluctuate. As a result, the output voltage Vout is disturbed.

The capacitor 50 in the current-cell matrix type D/A converter 10 of this embodiment absorbs fluctuations in the current sum Ios caused by the switching between selection and non-selection, thereby making it possible to suppress fluctuations in the offset voltage Vos to output a clear waveform of the output voltage Vout. Alternatively, a switch or the like may be associated with the capacitor in this embodiment to switch the fluctuation absorbing operation.

Figure 7:
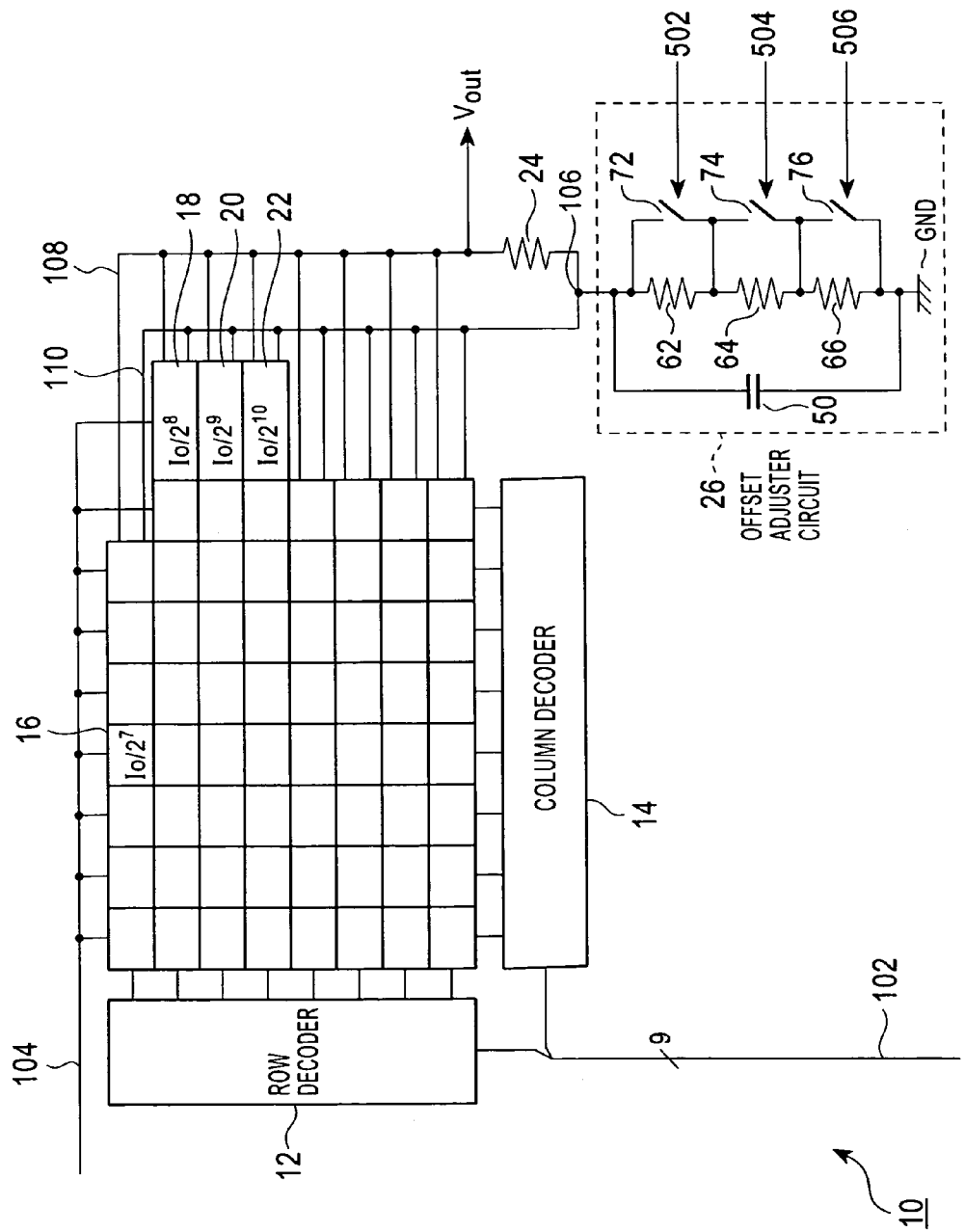
FIG. 7 is a block diagram showing another embodiment of the current-cell matrix type D/A converter according to the present invention.

As a further embodiment, in the current-cell matrix type D/A converter 10, the offset adjuster circuit 26 comprises an offset adjusting resistors 62, 64, 66 connected in series, a capacitor 50, and switches 72, 74, 76, as illustrated in FIG. 7.

In this embodiment, the offset adjusting resistors 62, 64, 66 and switches 72, 74, 76 may be incorporated, for example, in an LSI, or implemented by an external circuit.

The offset adjusting resistors 62, 64, 66 have resistance values Ros1, Ros2 and Ros3, respectively, and are connected to the corresponding switches 72, 74, 76, respectively.

The switches 72, 74, 76 operates in accordance with offset voltage adjusting signals 502, 504, 506, respectively. For example, the switches turn on when the offset voltage adjusting signals are at H level to circumvent the corresponding offset adjusting resistors. For example, PMOS transistors, NMOS transistors, or bipolar transistors are employed for the switches 72, 74, 76 in this embodiment.

Figure 8:
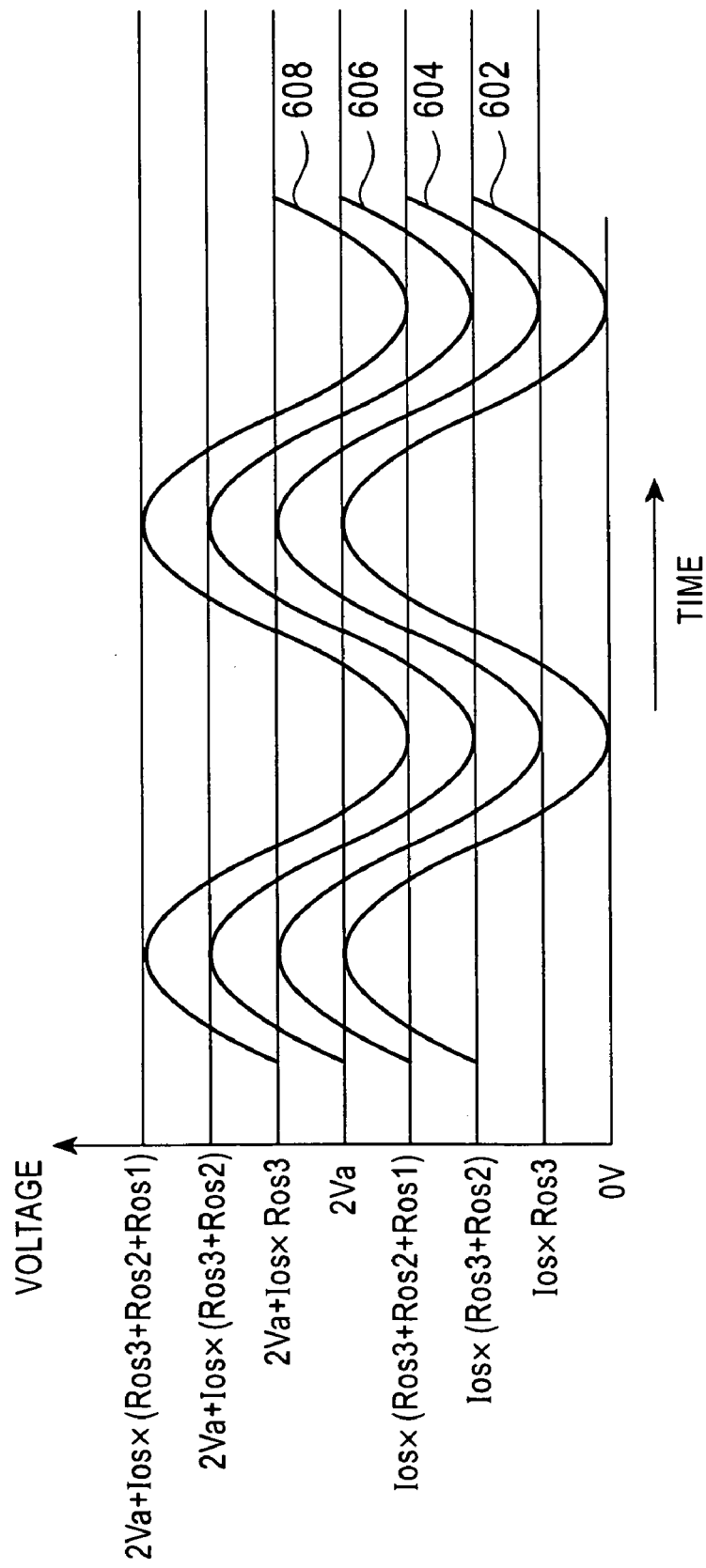
FIG. 8 is a diagram generally showing the waveform of an output voltage in the current-cell matrix type D/A converter shown in FIG. 5.

For example, when the current-cell matrix type D/A converter 10 of the embodiment is applied with digital data showing a sinusoidal wave having an amplitude va as an input code 102, the output voltage Vout represents a waveform which shows that an offset signal is generated in accordance with the offset voltage adjusting signal, as shown in FIG. 8.

In this event, when the offset voltage adjusting signals 502, 504, 506 are all at H level, the switches 72, 74, 76 are all turn on, and the offset adjusting resistors 62, 64, 66 are all circumvented. As a result, the offset voltage Vos in the offset adjusting circuit 26 is equal to zero, so that the output voltage Vout is output as indicated by a waveform 602 in FIG. 8. When the adjusting signals 502, 504 are at H level and the adjusting signal 506 is at L level, the switches 72, 74 are turned on, while the switch 76 is turned off, and the adjusting resistors 62, 64 are circumvented, but the adjusting resistor 66 is included in the current path, resulting in the offset voltage Vos calculated by Ros3×Ios. Thus, the output voltage Vout is output as indicated by a waveform 604 in FIG. 8. When the adjusting signal 502 is at H level and the adjusting signals 504, 506 are at L level, the switch 72 is turned on, while the switches 74, 76 are turned off, and the adjusting resistor 62 is circumvented, but the adjusting resistors 64, 66 are included in the current path, resulting in the offset voltage Vos calculated by (Ros2+Ros3)×Ios. Thus, the output voltage Vout is output as indicated by a waveform 606 in FIG. 8. When the adjusting signals 502, 504, 506 are all at L level, the switches 72, 74, 76 are all turned off, and the adjusting resistors 62, 64, 66 are all included in the current path, resulting in the offset voltage Vos calculated by (Ros1+Ros2+Ros2)×Ios. Thus, the output voltage Vout is output as indicated by a waveform 608 in FIG. 8.

While the offset voltage adjuster circuit 26 may include two or more multiple offset adjusting resistors, FIG. 8 shows only a small number of offset adjusting resistors 62, 64, 66 for avoiding the complexity. In this event, the offset voltage adjuster circuit 26 may include a number of switches as much as the offset adjusting resistors, corresponding to the multiple offset adjusting resistors, wherein offset voltage adjusting signals are supplied corresponding to these switches.

Figure 9:
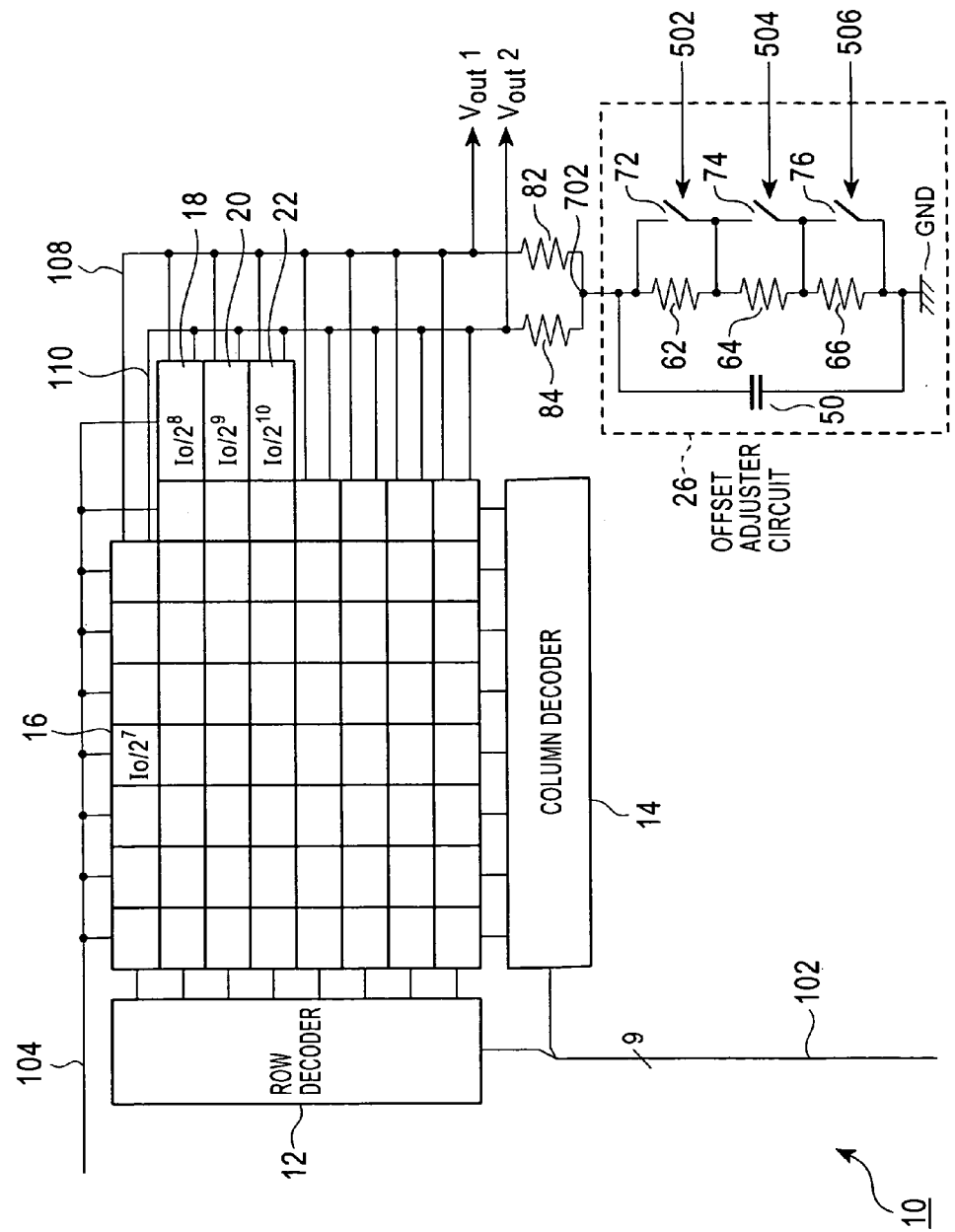
FIG. 9 is a block diagram showing another embodiment of the current-cell matrix type D/A converter according to the present invention.

As a further embodiment illustrated in FIG. 9, the current-cell matrix type D/A converter 10 supplies the load resistor 82 with the current Idac1 from all selected unit current cells through the connection line 108 to output a voltage Vout1, and supplies the load current 84 with the current Idac2 from all the non-selected unit current cell to output a voltage Vout2 for differential output.

In this embodiment, the load resistors 82, 84 have resistance values Rdac1, Rdac2, respectively, connected in parallel at a connection 702, and are connected to the offset adjuster circuit 26 through the connection 702.

Here, a current value supplied to the connection 702, i.e., the current value Ios supplied to the offset adjusting circuit 26 is calculated from the total sum of the current value Idac1 supplied to the load resistor 82 and the current value Idac2 supplied to the load resistor 84. This current sum Ios is constant irrespective of which unit current cell is selected, as described above, and the current sum Ios is calculated by $(I0/2^7)\times(2^6-1)+(I0/2^8)+(I0/2^9)+(I0/2^{10})$. Therefore, the current-cell matrix type D/A converter 10 of this embodiment can generate the offset voltage Vos without being affected by the load resistors 82, 84 even if the voltage Vout1 and voltage Vout2 are differentially output.

In this embodiment, the current values Idac1, Idac2 are such that their maximum value Ios and minimum value 0 are detected when all the unit current cells are selected, and the minimum value 0 and maximum value Ios are detected when non of the unit current cells is selected, thus having a relationship that Idac2 decreases as Idac1 increases with Ios at the maximum value, and Idac2 increases as Idac1 decreases. In other words, the current values Idac1, Idac2 have a mutually reverse relationship.

In this event, when the load resistors 82, 84 are in a relationship represented by Rdac1=Rdac2 in their resistance values, the current values Idac1, Idac2 are reverse to each other, so that the voltage Vdac1 across the load resistor 82 and the voltage Vdac2 across the load resistor 84 are reverse to each other.

Figure 10:
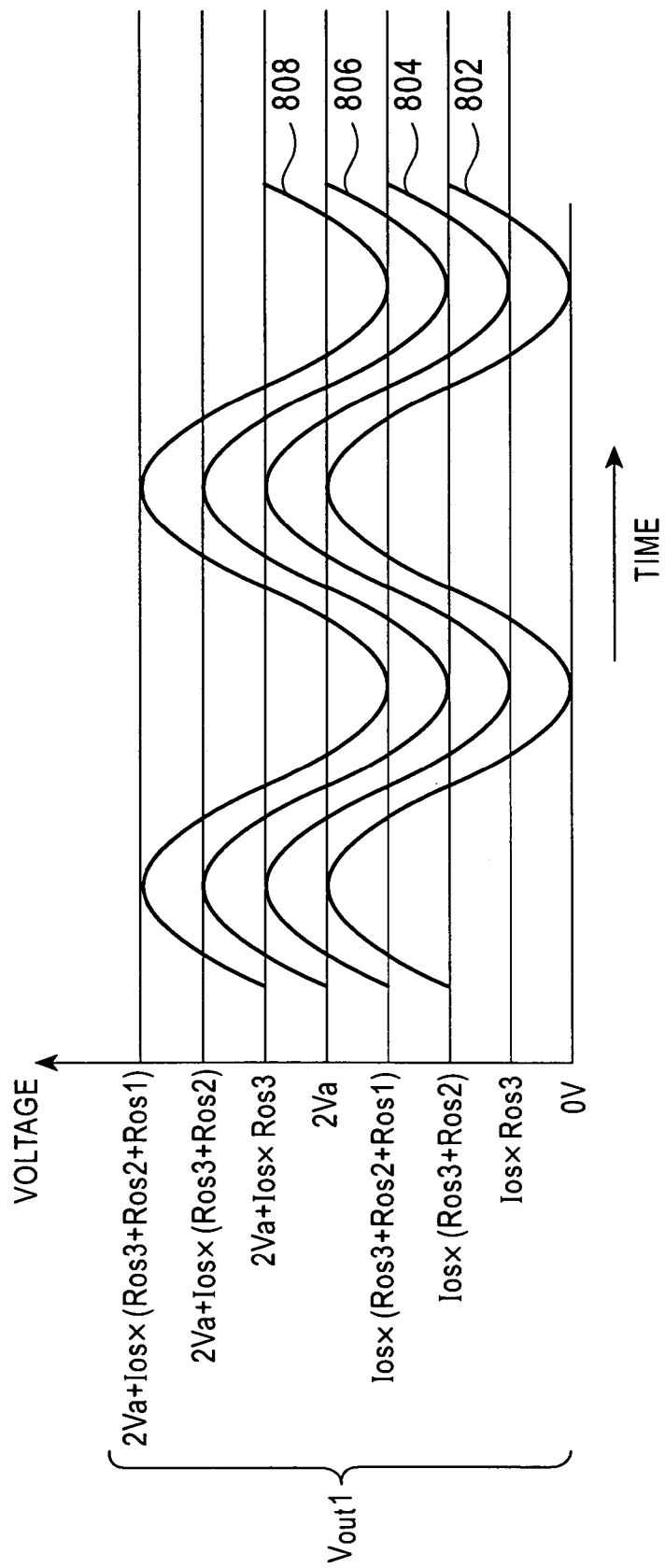
FIG. 10 is a diagram generally showing the waveform of an output voltage in the current-cell matrix type D/A converter shown in FIG. 6.
Figure 11:
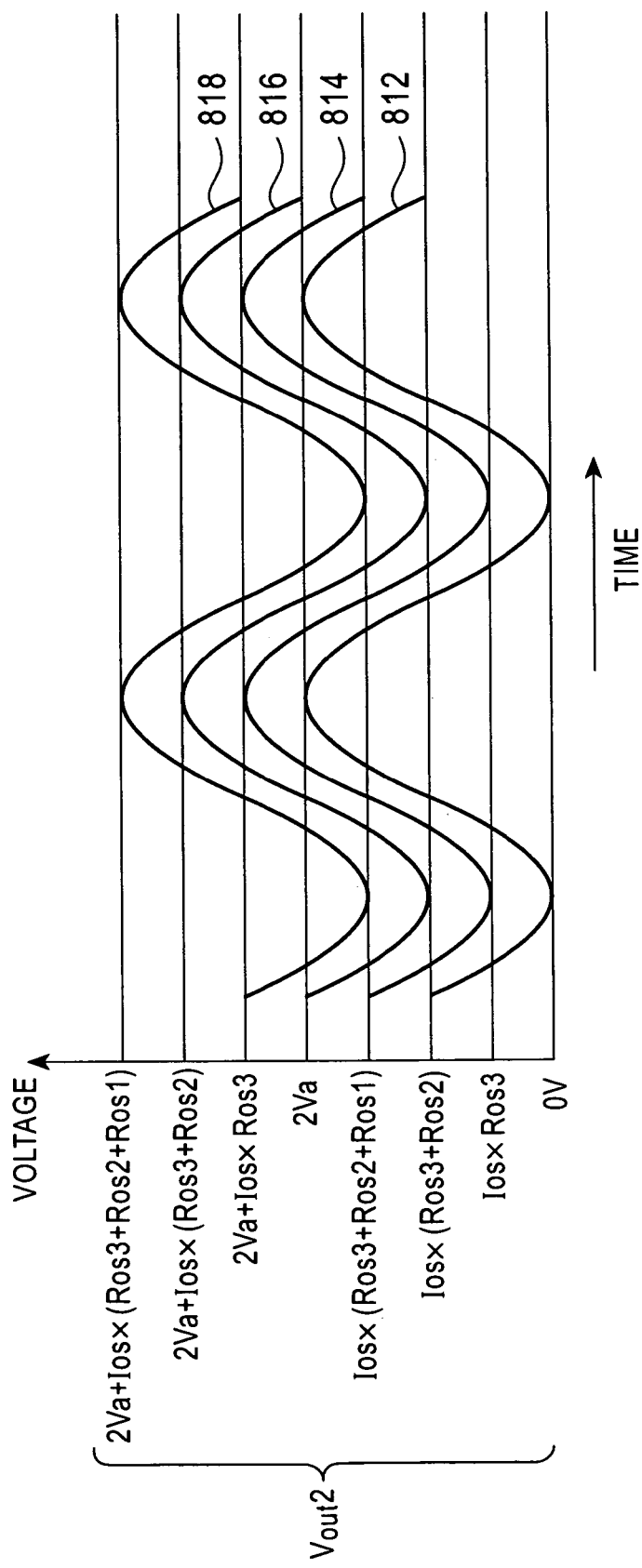
FIG. 11 is a diagram generally showing the waveform of an inverted output voltage in the current-cell matrix type D/A converter shown in FIG. 6.
Figure 12:
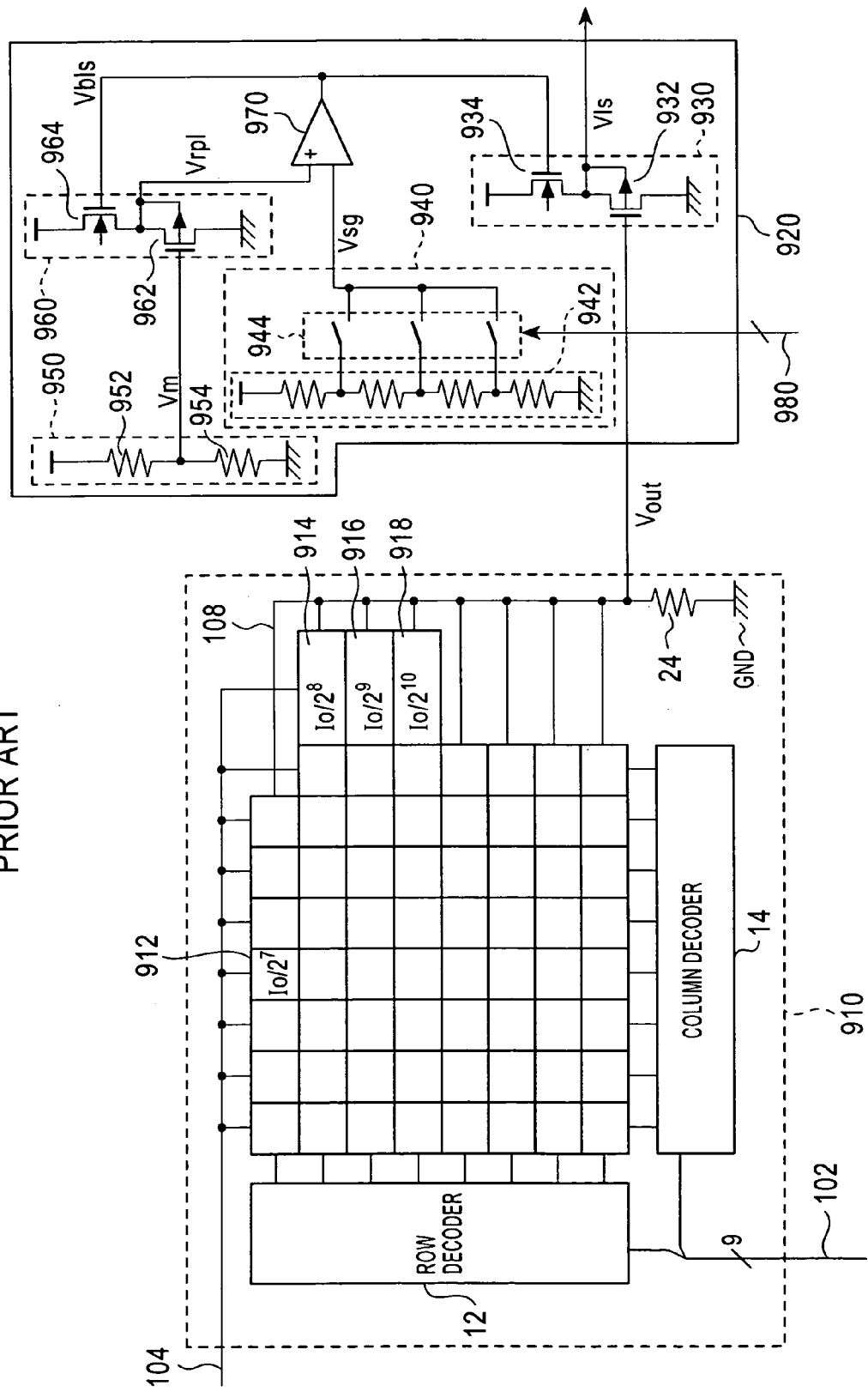
FIG. 12 is a diagram showing a conventional current-cell matrix type D/A converter.
Figure 13:
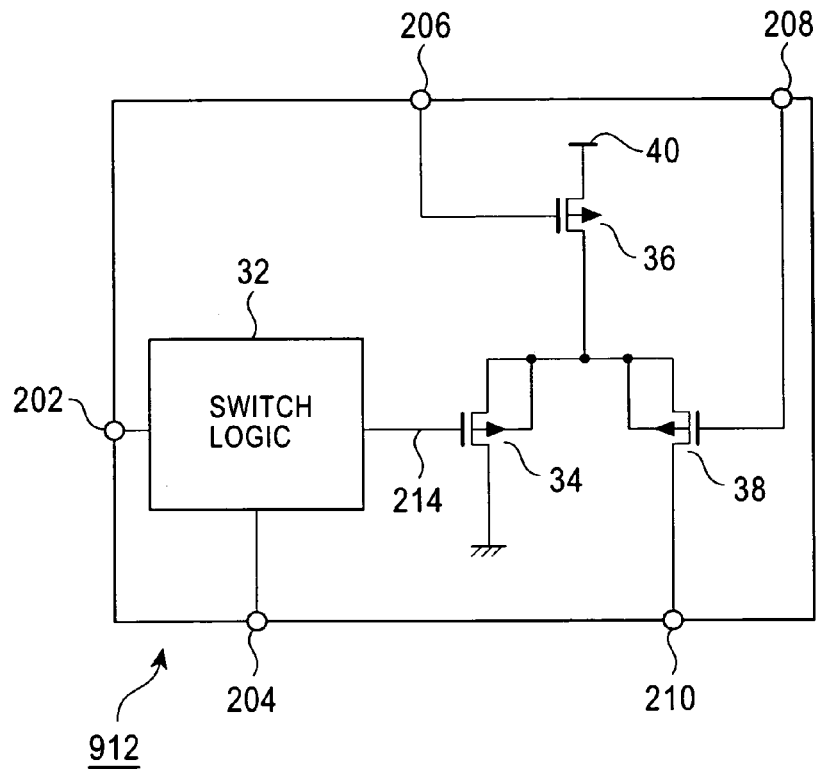
FIG. 13 is a block diagram illustrating a unit current cell in the conventional current-cell matrix type D/A converter shown in FIG. 9.
Figure 14:
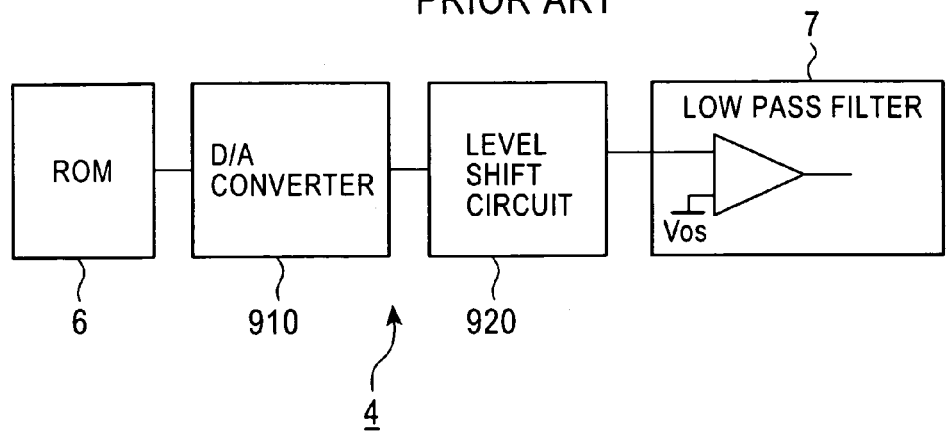
FIG. 14 is a block diagram showing an exemplary configuration of the conventional current-cell matrix type D/A converter when it is applied to the signal waveform generator in the transmitter shown in FIG. 4.

For example, digital data of a sinusoidal wave having an amplitude of va is input as the input code 102, the output voltage Vout1 from selected unit current cells is represented by waveforms 802, 804, 806, 808, in accordance with the offset voltage, as shown in FIG. 10. On the other hand, the output voltage Vout2 from non-selected unit current cells is represented by waveforms 812, 814, 816, 818, as shown in FIG. 11. The shown waveforms are reverse to each other.

As described above, the current-cell matrix type D/A converter 10 of this embodiment can generate an offset voltage and further adjust the offset voltage value even if differential voltages are output.

The invention has been described with reference to the preferred embodiments thereof. It should be understood by those skilled in the art that a variety of alterations and modifications may be made from the embodiments described above. It is therefore contemplated that the appended claims encompass all such alterations and modifications.

This application is based on Japanese Patent Application No.2004-060412 which is hereby incorporated by reference.

What is claimed is:

1. A current-cell matrix type digital-to-analog converter comprising:
   a plurality of unit current cells arranged in a matrix form, each being selected or non-selected in accordance with a digital signal;
   a first connection line supplied with a first current from all selected unit current cells of said plurality of unit current cells; and
   a first load resistor connected to said first connection line and supplied with the first current;
   wherein said converter includes:
   a second connection line supplied with a second current from all non-selected unit current cells of said plurality of unit current cells, said second current being an inverted output of the first current; and
   an offset adjuster circuit connected to said first connection line through a first load resistor and connected to said second connection line, wherein
   said offset adjuster circuit produces a constant voltage based on the first current supplied from said first connection line and a second current supplied from said second connection line irrespective of whether said plurality of unit current cells are selected or non-selected, to generate an offset voltage, and
   said converter outputs a first analog voltage signal based on a first potential generated across the first load resistance from the first current and said offset voltage.

2. A current-cell matrix type digital-to-analog converter according to claim 1, wherein said offset adjuster circuit includes an offset adjusting resistor which has one end grounded and the other end from which the first current and the second current are supplied.

3. A current-cell matrix type digital-to-analog converter according to claim 2, wherein said offset adjuster circuit includes a capacitor connected in parallel with said offset adjusting resistor.

4. A current-cell matrix type digital-to-analog converter according to claim 2, wherein said offset adjusting circuit includes a plurality of adjusting resistors as said offset resistor.

5. A current-cell matrix type digital-to-analog converter according to claim 4, wherein said offset adjuster circuit has said plurality of adjusting resistors connected in series as said offset adjusting resistor.

6. A current-cell matrix type digital-to-analog converter according to claim 4, wherein said offset adjuster circuit includes a switch connected in parallel with each of said plurality of adjusting resistors, wherein said switch can be adjusted by offset voltage adjusting signal.

7. A current-cell matrix type digital-to-analog converter according to claim 1, further comprising a second load resistor supplied with a second current, said second current being supplied to said offset adjuster circuit through said second load resistor, wherein a second analog voltage signal is differentially output as an inverted version of the first analog signal based on a second potential generated across said second load resistor from the second current, and the offset voltage.

* * * * *